United States Patent [19]

Kim et al.

[11] Patent Number: 5,717,649

[45] Date of Patent: Feb. 10, 1998

[54] SEMICONDUCTOR MEMORY DEVICE USING SUB-WORDLINE DRIVERS HAVING WIDTH/LENGTH RATIO OF TRANSISTORS VARIES FROM CLOSEST TO FARTHEST LOCATION FROM MEMORY BLOCK SELECTION CIRCUITS

[75] Inventors: Seung Bong Kim; Jong Hoon Park, both of Kyungki-Do, Rep. of Korea

[73] Assignee: LG Semicon Co., Ltd., Cheongju, Rep. of Korea

[21] Appl. No.: 586,393

[22] Filed: Jan. 16, 1996

[30] Foreign Application Priority Data

Dec. 16, 1995 [KR] Rep. of Korea ............... 51094/1995

[51] Int. Cl.[6] ................................................ G11C 8/00
[52] U.S. Cl. ............................ 365/230.06; 365/230.03
[58] Field of Search ............................. 365/230.06, 230.03

[56] References Cited

U.S. PATENT DOCUMENTS

Re. 32,993 7/1989 Anami et al. ................... 365/230.03
5,193,076 3/1993 Houston ............................ 365/233.5
5,305,279 4/1994 Park et al. ...................... 365/230.03

Primary Examiner—David C. Nelms
Assistant Examiner—Andrew Q. Tran
Attorney, Agent, or Firm—Fleshner & Kim

[57] ABSTRACT

An improved word line driving circuit for a memory device reduces a driving speed difference between an assistant word line driving unit, which is closest to a memory cell block selection unit, and an assistant word line driving unit, which is farthest from the memory cell block selection unit, for selecting a block of memory cell. Further, the improved circuit substantially allows a non-overlap margin between word lines by differing the size of an assistant word line driving unit connected to each word line according to its location. The improved circuit also includes a memory cell block selection unit for outputting a block selection signal so as to select a memory cell block, a plurality of main word line driving units for outputting a main word line signal, and a plurality of assistant word line driving units.

16 Claims, 5 Drawing Sheets

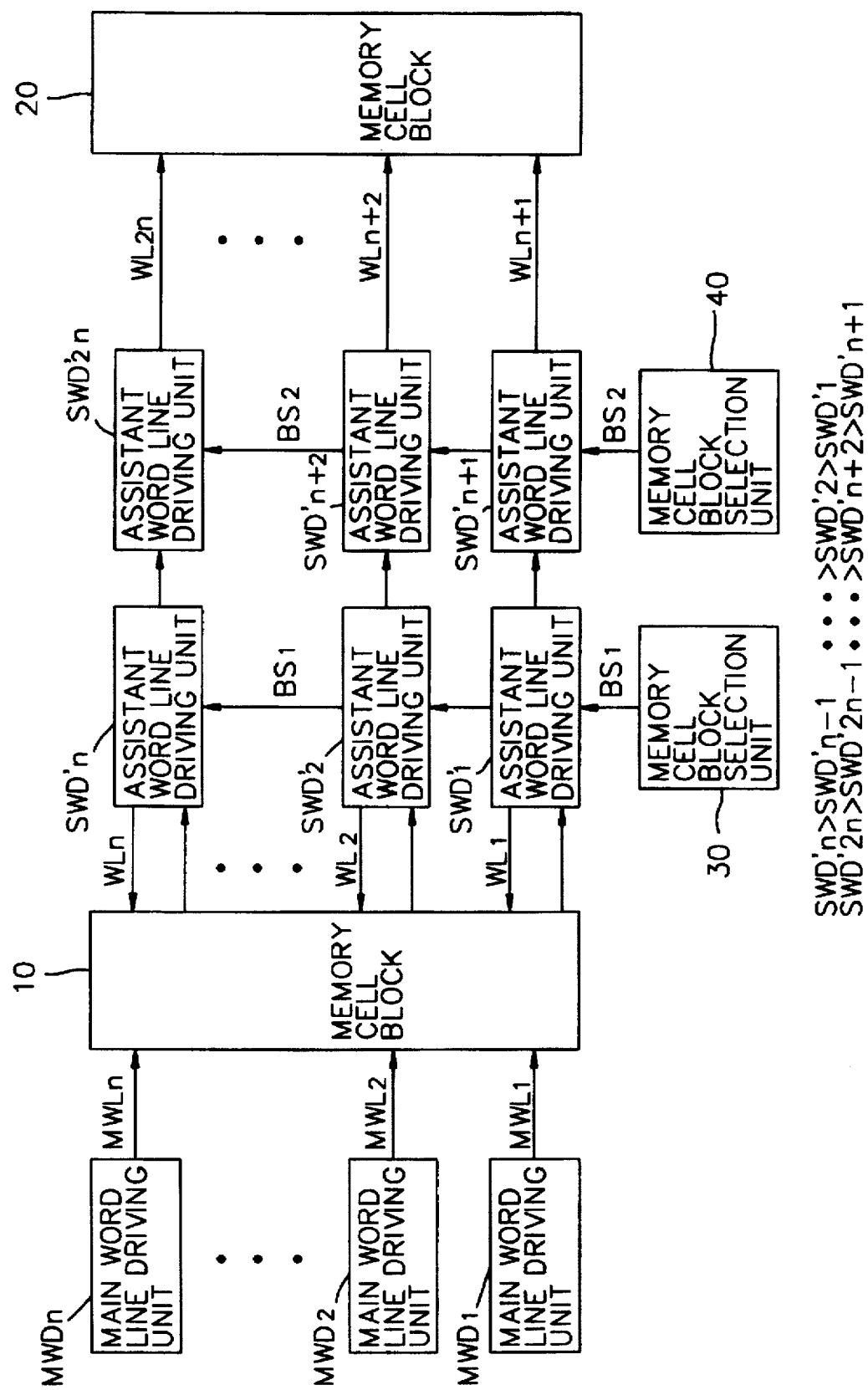

SWD'n > SWD'n−1 · · · SWD'2 > SWD'1

SEMICONDUCTOR MEMORY DEVICE USING SUB-WORDLINE DRIVERS HAVING WIDTH/LENGTH RATIO OF TRANSISTORS VARIES FROM CLOSEST TO FARTHEST LOCATION FROM MEMORY BLOCK SELECTION CIRCUITS

BACKGROUND OF THE INVENTION

1. Field of the Invention

The present invention relates to a word line driving circuit for a memory, and more particularly to an improved word line driving circuit for a memory capable of advantageously reducing a driving speed difference between a word line driving circuit, which is nearmost from a memory cell block selection unit, and a word line driving circuit, which is farmost from the memory cell block selection unit for selecting a block of memory cell, and capable of substantially obtaining a non-overlay margin between word lines by differing the W/L size of transistors in a word line driving circuit connected to each word line.

2. Description of the Conventional Art

FIG. 1 illustrates a conventional word line driving circuit for a memory device having a plurality of memory cell blocks 10 and 20, each having memory cells of "n" rows and "m" columns. The word line driving circuit includes memory cell block selection units 30 and 40 for outputting block selection signals BS1 and BS2 so as to select memory cell blocks 10 and 20, and "n" main word line driving unit MWD1 through MWDN for outputting main word line signals MWL1 through MWLN. The circuit also includes "n" assistant word line driving units SWD1 through SWDn for receiving block selection signals BS1 outputted from the memory cell block selection unit 30 and main word line signals MWL1–MWLn from the main word line driving units MWD1 through MWDN and for outputting word line signals WL1 through WLN so that one row can be selected from "n" rows of the memory cell block 10, and "n" assistant word line driving units SWDn+1 through SWD2n for receiving main word line signals MWL1 through MWLn outputted from the word line driving units MWD1 through MWDN and a block selection signal BS2 outputted from the memory cell block selection unit 40 and for outputting word line signals WLN+1 through WD2n so that one row can be selected from "n" rows of the memory cell block 20.

The operation of the conventional word line driving circuit will now be explained with reference to the accompanying drawings.

For example, if main word line driving unit MWD1 is enabled, the remaining main word line driving units MWD2 throughMWDn are disabled. Thereafter, the main word line driving unit MWD1, as shown in FIG. 2A, outputs a main word line signal MWL1. The date of the memory cell block 10 is accessed, and the memory cell block selection unit 30 is enabled, while the memory cell block selection unit 40 is disabled. The memory cell block selection unit 30, as shown in FIG. 2B, outputs the block selection signal BS1 to the assistant word line driving units SWD1 through SWDn.

Therefore, an assistant word line driving unit SWD1 of the "n" assistant word line driving units SWD1 through SWDn is selected, and the selected assistant word line driving unit SWD1, as shown in FIG. 2C, outputs a word line signal WL1 to the memory cell block 10.

In addition, as shown in FIG. 3A, when an assistant word line driving unit SWDn is selected in accordance with the main word line signal MWLn and the block selection signal BS1, the word line signal WLn is outputted to the memory cell block 10.

Meanwhile, when the data of the memory cell block 20 is accessed, the memory cell block selection unit 40 is enabled and outputs a block selection signal BS2, and one assistant word line driving unit is selected from the assistant word line driving units SWDn+1 through SWD2n.

In the above-explained conventional word line driving circuit, an assistant word line driving unit, e.g., SWD1, near the memory cell block selection unit quickly outputs a word line signal in accordance with the main word line signal and block selection signal. However, an assistant word line driving unit, e.g., SWDn, far from the memory cell block selection unit outputs a delayed word line signal. That is, the block selection signal is delayed due to the resistance of the block selection signal line, capacitance of the line, the gate capacitance and source/drain capacitance of the assistant word line driving unit connected to the block selection signal, etc. so that the assistant word line driving unit far from the memory cell block selection unit outputs a delayed word line signal. Therefore, as shown in FIGS. 2 and 3, the word line signal WLn is delayed by a time period "d1" compared to the word line signal WL1 and the enable time of the assistant word line driving unit is determined by the word line signal WLn.

In addition, when an assistant word line driving unit closest to the memory cell block selection unit is enabled and the assistant word line driving unit farthest from the memory cell block selection unit is disabled, the enabling time is quick, whereas the disabling time is slow, so that the non-overlap margin between the word line signals outputted from the above mentioned two assistant word line driving units is reduced.

SUMMARY OF THE INVENTION

Accordingly, it is an object of the present invention to provide a word line driving circuit for a memory, which overcome the problems encountered in a conventional word line driving circuit for a memory.

It is another object of the present invention to provide an improved word line driving circuit for a memory capable of advantageously reducing a driving speed difference between a word line driving circuit, which is nearmost from a memory cell block selection unit, and a word line driving circuit, which is farmost from the memory cell block selection unit for selecting a block of memory cell, and capable of substantially obtaining a non-overlap margin between word lines by differing the size of a word line driving circuit connected to each word line according to its location.

To achieve the above objects, there is provided a word line driving circuit for a memory, which includes a memory cell block selection unit for outputting a block selection signal so as to select a memory cell block; a plurality of main word line driving units for outputting a main word line signal; and a plurality of assistant word line driving units, sequentially and quickly enabled, for receiving main word line signals outputted from the main word line driving means and a block selection signal outputted from the memory cell block selection means and for outputting word line signals.

BRIEF DESCRIPTION OF THE DRAWINGS

FIG. 4A is a block diagram of a word line driving circuit in accordance with the present invention.

DETAILED DESCRIPTION OF THE INVENTION

Figure 1:
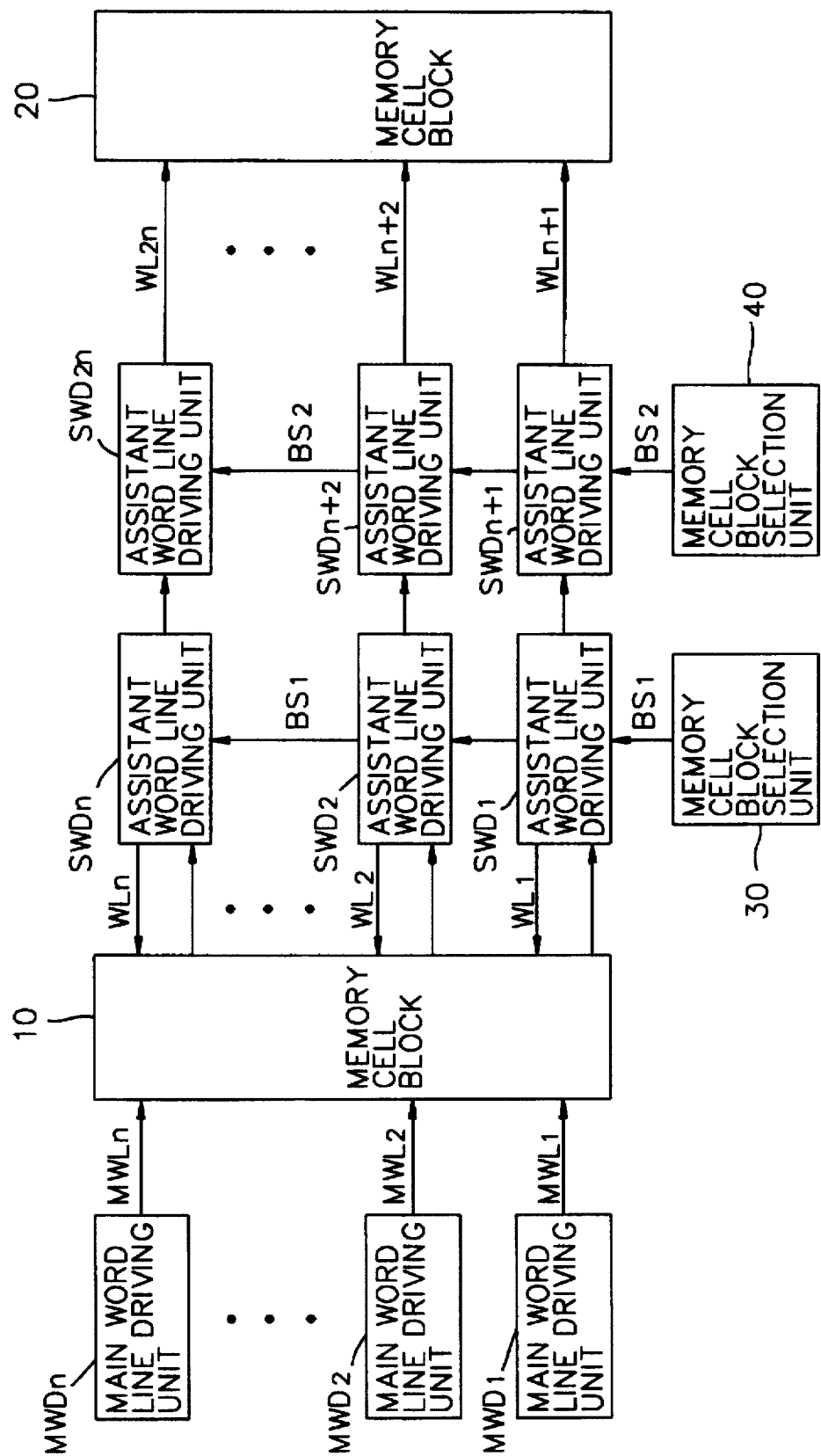
FIG. 1 is a block diagram of a convention word line driving circuit for a memory device.
Figure 2A:
FIG. 2A is a wave form of an inputting main word line signal of an assistant word line driving unit which is closest to a memory cell block selection unit of FIG. 1.
Figure 2B:
FIG. 2B is a wave from of an inputting block selection signal of an assistant word line driving unit which is closest to a memory cell block selection unit of FIG. 1.
Figure 2C:
FIG. 2C is a wave from of an outputting word line signal of an assistant word line driving unit which is closest a memory cell block selection unit of FIG. 1.
Figure 3A:
FIG. 3A is a wave form of an inputting main word line signal of an assistant word line driving unit which is farthest from a memory cell block selection unit of FIG. 1.
Figure 3B:
FIG. 3B is a wave form of an inputting block selection signal of an assistant word line driving unit which is farthest from a memory cell block selection unit of FIG. 1.
Figure 3C:
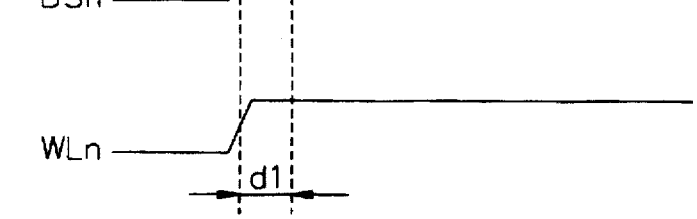
FIG. 3C is a wave form of an outputting word line signal of an assistant word line driving unit which is farthest from a memory cell block selection unit of FIG. 1.
Figure 4B:
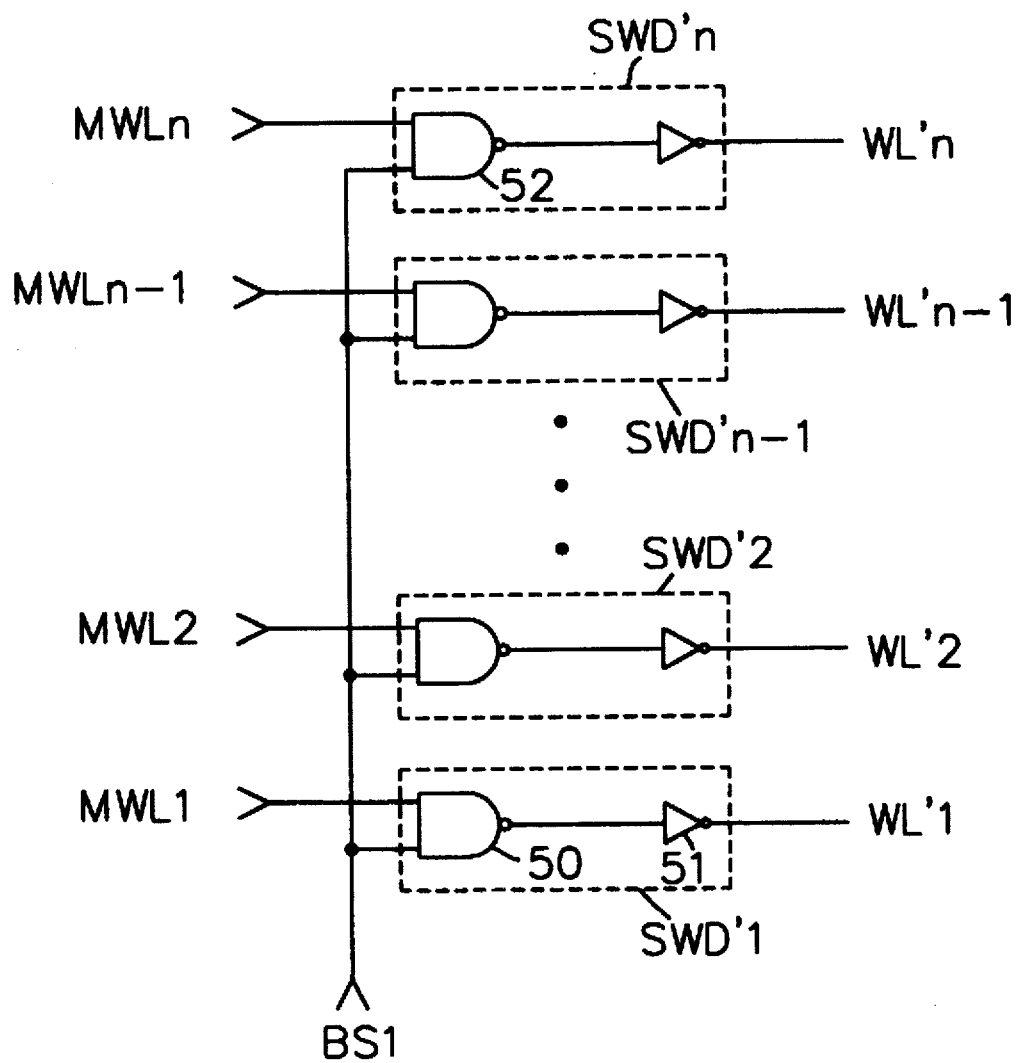
FIG. 4B is a circuit diagram of an assistant word line driving unit illustrated in FIG. 4A according to the present invention.

FIG. 4A is a block diagram of the word line driving circuit in accordance with the present invention and FIG. 4B shows an assistant word line driving unit according to the present invention. The memory device includes a plurality of memory cell blocks 10 and 20, each having cells of "n" rows and "m" columns, and "n" main word line driving units MWD1 and MWDN and memory cell block selection units 30 and 40, which are connected the same as the conventional word line driving units. In addition, "n" assistant word line driving units SWD'1 through SWD'n and SWD'n+1 through SWD'2n each having a relatively small size when the memory cell block selection units 30 and 40 are disposed near therefrom.

Here the size of the assistant word line driving units SWD'1 through SWD'n−1 is smaller than that of the conventional assistant word line driving units SWDi (where, I=1~2n), and the size of the assistant word driving unit SWD'n is the same as the conventional assistant word line driving unit SWDi.

The assistant word line driving unit SWD'1, as shown in FIG. 4B includes a NAND-gate 50 for NANDing the main word line signal MWL1 and the block selection signal BS1, and an inventor 50 for inverting the output signal of the NAND-gate 50 and for outputting the word line signal WL'1. In addition, the assistant word line driving units SWD'2 through SWD'n receive the word line signals MWL'2 through MWL'n and the block selection signal BS1 and outputs word line signals WL'2 through WL'n and has the same construction as the assistant word line driving unit SWD'1.

The operation and effects of the word line driving circuit for a memory will be explained with reference to the accompanying drawings.

Figure 5A:
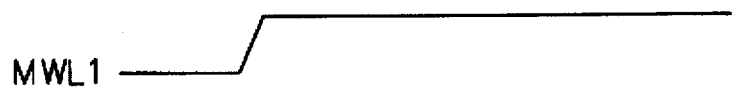
FIG. 5A is a wave form of an input main word line signal of a word assistant word line driving unit which is closest to a memory cell block selection unit according to the present invention.
Figure 5B:
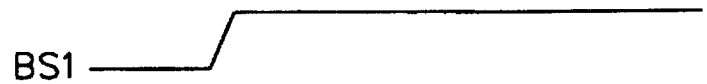
FIG. 5B is a wave form of an input block selection signal of an assistant word line driving unit which is closest to a memory cell block selection unit according to the present invention.
Figure 5C:
FIG. 5C is a wave form of an output word line signal of an assistant word line driving unit which is closest to a memory cell block selection unit according to the present invention.

As shown in FIGS. 5A and 5B, when the main word line signal MWL1 and the block selection signal BS1 are applied to the assistant word line driving unit SWD'1 closest to the memory cell block selection unit 30, the NAND-gate 50 of the assistant word line driving unit SWD'1 NANDs the signals MLW1 and BS1, and the inverter 51 inverts the output signal of the NAND-gate 50 and, as shown in FIG. 5C, outputs a word line signal WL'1 to the memory cell block 10.

Here, since the size of the assistant word line driving unit SWD'1 is smaller than that of the conventional one, it is enabled more slowly.

Figure 6A:
FIG. 6A is a wave form of an input main word line signal of an assistant word line driving unit which is farthest from a memory cell block selection unit according to the present invention.
Figure 6B:
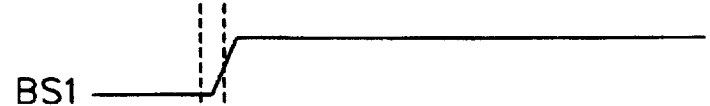
FIG. 6B is a wave form of an input block selection signal of an assistant word line driving unit which is farthest from a memory cell block selection unit according to the present invention.
Figure 6C:
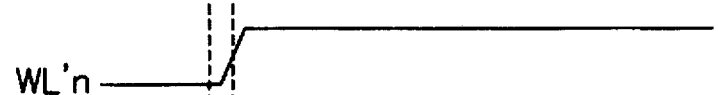
FIG. 6C is a wave form of an outputting word line signal of an assistant word line driving unit which is farthest from a memory cell block selection unit according to the present invention.

Meanwhile, as shown in FIGS. 6A and 6B, a main word line signal MWLn and a block selection signal BS1 are applied to the assistant word line driving unit SWD'n farthest from the memory cell block selection unit 30. Since the assistant word line driving unit SWD'n has a relatively large size, it is more quickly enabled and outputs a word line signal NL'n to the memory cell block 10, as shown in FIG. 6C.

That is, the resistance and the capacitance due to the line of the block selection signal BS1 is the same as the admitted prior art. However, since the transistor contained in the NAND-gate 52 of the assistant word line driving unit SWD'n and having a relatively large size, the gate capacitance and the source/drain capacitance of the transistor becomes small, so that delay time "d2", which is smaller than that of the admitted prior art, occurs.

As described above, the word line driving circuit for a memory according to the present invention is directed to advantageously reducing a driving speed difference between a word line driving circuit and substantially obtaining a non-overlay margin between word lines by differing the size of a word line driving circuit connected to each word line according to its location.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A word line driving circuit for a memory device having a plurality of memory cell blocks, each memory cell block having a plurality of memory cells arranged in rows and columns, comprising:

memory cell block selection means for outputting a block selection signal to select one of the plurality of memory cell blocks;

a plurality of main word line driving units for outputting a plurality of main word line signals; and a plurality of assistant word line driving units, coupled to said plurality of memory cell blocks, memory cell block selection means, and plurality of main word line driving units, for receiving the plurality of main word line signals outputted from said plurality of main word line driving units and the block selection signal outputted from said memory cell block selection means and for outputting word line signals such that one of the rows of memory cells are selected, wherein said plurality of assistant word line driving units are arranged in a manner that an assistant word line driving unit closer to the memory cell block selection means has a transistor of a smaller size than the transistor of another assistant word line driving unit farther from the memory cell block selection means.

2. The circuit of claim 1, wherein each of said plurality of assistant word line driving units includes:

a NAND-gate for NANDing said main word line signal and said block selection signal; and an inverter for inverting the output signal of said NAND-gate and for outputting the word line signal.

3. The circuit of claim 1, wherein said memory cell block selection means comprises first and second memory cell block selection units, and said plurality of assistant word line driving units comprises first and second columns of assistant word line driving units, said first and second memory cell block selection units generating first and second block selection signals to said first and second columns of assistant word line driving units, respectively.

4. The circuit of claim 1, wherein each of said plurality of said assistant word line driving units comprises:

a first logic gate for performing a first logical operation on said main word line signal and said block selection signal; and a second logic gate for performing a second logical operation on the output of said first logic gate to output the word line signal.

5. The circuit of claim 4, wherein said first logic gate is a NAND gate, and said second logic gate is an inverter.

6. The circuit of claim 1, wherein the transistor in each assistant word line driving unit becomes larger as the assistant word line driving unit is located farther from the memory cell block selection means.

7. The circuit of claim 4, wherein the transistor in the first logic gate of an assistant word line driving unit closest to said memory cell block selection means has the smallest size.

8. The circuit of claim 7, wherein the transistor in the first logic gate of an assistant word line driving unit farthest from said memory cell block selection means has the largest size.

9. The circuit of claim 8, wherein the transistor in the first logic gate of the assistant word line driving units between the closest and the farthest assistant word line driving unit gradually becomes larger.

10. A memory device comprising:

a) a first memory cell block having a first plurality of memory cells arranged in rows and columns;

b) a first memory cell block selection unit for generating a first block selection signal;

c) a plurality of main word line driving units for outputting a plurality of main word line signals; and d) a first plurality of assistant word line driving units coupled to said first memory cell block, being responsive to the first block selection signal outputted from said first memory cell block selection unit to select said first memory cell block, and being responsive to corresponding one of the plurality of main word line signals outputted from a corresponding main word line driving unit to select one of the rows of memory cells of said first memory cell block, wherein each of said first plurality of assistant word line driving units comprises:

i) a first logic gate for performing a first logical operation on the main word line signal and said first block selection signal; and ii) a second logic gate for performing a second logical operation on the output of said first logic gate to output a word line signal to select one of the rows of memory cells in said first memory cell block, wherein an assistant word line driving unit of said first plurality of assistant word line driving units, which is closer to said first memory cell block selection unit, has a transistor of a different size in the first logic gate than the transistor in the first logic gate of another assistant word line driving unit farther from said first memory cell block selection unit.

11. The memory device of claim 10 further comprising:

a second memory cell block having a second plurality of memory cells arranged in rows and columns;

a second memory cell block selection unit for generating a second block selection signal; and a second plurality of assistant word line driving units being responsive to the second block selection signal outputted from said second memory cell block selection unit to select said second memory cell block, and being responsive to corresponding one of the plurality of main word line signals outputted from a corresponding main word line driving unit to select one of the rows of memory cells of said second memory cell block, said second plurality of assistant word line driving units having the same construction as said first plurality of assistant word line driving units.

12. The memory device of claim 10, wherein said first logic gate is a NAND gate, and said second logic gate is an inverter.

13. The memory device of claim 10, wherein the closer assistant word line driving unit has said a transistor of a smaller size than said transistor of the farther assistant word line driving unit.

14. The memory device of claim 13, wherein the transistor in the first logic gate of an assistant word line driving unit closest to said first memory cell block selection unit has the smallest size.

15. The memory device of claim 14, wherein the transistor in the first logic gate of an assistant word line driving unit farthest from said first memory cell block selection unit has the largest size.

16. The memory device of claim 15, wherein the transistor in the first logic gate of the assistant word line driving units between the closest and the farthest assistant word line driving unit becomes gradually larger.

* * * * *